US006992379B2

(12) United States Patent
Alcoe et al.

(10) Patent No.: US 6,992,379 B2
(45) Date of Patent: Jan. 31, 2006

(54) ELECTRONIC PACKAGE HAVING A THERMAL STRETCHING LAYER

(75) Inventors: David J. Alcoe, Vestal, NY (US); Li Li, Plano, TX (US); Sanjeev B. Sathe, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 09/947,098

(22) Filed: Sep. 5, 2001

(65) Prior Publication Data

US 2003/0047807 A1    Mar. 13, 2003

(51) Int. Cl.
*H01L 23/053*    (2006.01)
*H05K 1/03*    (2006.01)

(52) U.S. Cl. .................. 257/700; 257/738; 257/758; 257/778; 257/780; 257/786; 174/52.1; 174/255; 174/256

(58) Field of Classification Search ............... 257/700, 257/701, 737, 738, 758, 774, 778, 779, 780; 257/678, 702, 759, 786; 174/52, 4, 255, 174/256, 260, 262, 52.1–52.3; 428/209, 428/210, 2
See application file for complete search history.

(56) References Cited

U.S. PATENT DOCUMENTS

| 4,496,793 | A | | 1/1985 | Hanson et al. ............. 174/68.5 |
| 5,120,573 | A | * | 6/1992 | Miyazaki et al. ............. 427/96 |
| 5,879,786 | A | * | 3/1999 | Budnaitis et al. ............ 428/209 |
| 5,888,630 | A | | 3/1999 | Sylvester et al. ............ 428/212 |
| 5,888,631 | A | * | 3/1999 | Sylvester ..................... 428/212 |
| 5,949,137 | A | * | 9/1999 | Domadia et al. ............ 257/712 |
| 5,968,589 | A | | 10/1999 | Murakami .................... 427/96 |
| 6,060,341 | A | | 5/2000 | Alcoe et al. ................. 438/123 |
| 6,228,470 | B1 | * | 5/2001 | Kresge et al. ............... 428/213 |
| 6,264,851 | B1 | | 7/2001 | Markovich et al. ........... 216/39 |
| 6,407,334 | B1 | * | 6/2002 | Jimarez et al. ............. 174/52.4 |
| 6,497,943 | B1 | * | 12/2002 | Jimarez et al. ............. 428/209 |
| 6,528,179 | B1 | * | 3/2003 | Jimarez et al. ............. 428/620 |

OTHER PUBLICATIONS

IBM Technical Disclosure Bulletin, pp 17-18, Dec. 1987, "Measurement of Tension in Polyimide Film Chip C Modules".

* cited by examiner

*Primary Examiner*—Alonzo Chambliss
(74) *Attorney, Agent, or Firm*—Schmeiser, Olsen & Watts; William H. Steinberg (57) ABSTRACT

An electronic package and method of making same in which a circuitized substrate having a first stiffness includes a plurality of electrically conductive circuit members on a first portion of the circuitized substrate and is adapted for having solder connections thereon and for being electrically connected to a semiconductor chip. A stiffener layer having a second stiffness is positioned on a second portion of the circuitized substrate relative to the first portion, the second stiffness of the stiffener layer distributing a portion of the first stiffness of said circuitized substrate so as to substantially prevent failure of the solder connections between the electrically conductive circuit members and the semiconductor chip during operation of the electronic package.

22 Claims, 7 Drawing Sheets

ELECTRONIC PACKAGE HAVING A THERMAL STRETCHING LAYER

TECHNICAL FIELD

The present invention relates to an electronic package for making electrical interconnection between a circuitized substrate and a semiconductor chip; more particularly, the electronic package includes a stiffener layer that substantially prevents failure of electrical interconnections between the electronic package and the semiconductor chip during manufacture and operation.

BACKGROUND OF THE INVENTION

A semiconductor chip may be mechanically and electrically interconnected to a circuitized substrate (e.g., a circuit board) of an electronic package, such as a chip carrier, by having conductive contacts on the chip (e.g., solder balls) solderably coupled to electrically conductive circuit members on the top surface of the chip carrier. For example, there may be large metal pads, such as copper pads, on the bottom of the chip carrier to accommodate a ball grid array of solder balls for coupling the chip carrier to a circuit card, and smaller amounts of metal on the top surface of the chip carrier, such as in the form of copper electrically conductive circuit members which comprise circuitization and/or pads for solderably joining the semiconductor chip to the chip carrier. The chip carrier may also include multiple layers of a flexible or compliant dielectric material and may exhibit substantial flexible characteristics. During build and operation of the chip carrier, including power up and power down cycling, the chip carrier experiences temperature changes. During these temperature changes, a spatial distribution of coefficient of thermal expansion (CTE) in the chip carrier coupled with the compliancy of the chip carrier, may cause the chip carrier to bow (or flex) upward or downward and thus deviate from planarity.

This chip carrier flexing increases in severity if a substantial portion of the chip carrier is made of compliant material, such as compliant organic material which cannot be easily handled (e.g., a material having a stiffness of less than about 10 Million pounds per square inch (Mpsi)). An organic chip carrier that is highly compliant may benefit from a rigid "stiffener ring" bonded to an outer perimeter of the top surface of the organic chip carrier in order to enhance the structural characteristics of the organic chip carrier. That is, the stiffener ring makes the organic chip carrier more mechanically stable and thus easier to handle. Unfortunately the stiffener ring assembly with bonding adhesive acts as a mechanical clamp on the outer perimeter of the organic chip carrier that constrains outer portions of the chip carrier from expanding, particularly when subjected to elevated and varying temperature. This constraint can occur during processing and usage, even if the thermal expansion coefficients of the stiffener ring and the organic chip carrier are matched, due to temperature gradients within the chip carrier which can cause expansion mismatches. Further, the bonding adhesive may also have thermomechanical expansion characteristics which are different than those of the organic chip carrier. In contrast, center portions of the organic chip carrier, to which a chip is typically attached, are not constrained by the stiffener ring. Thus, expansion of the central portions, when heated, accentuates chip carrier bowing by causing a distinct upward bulge in the central portion of the organic chip carrier.

Figure 1:
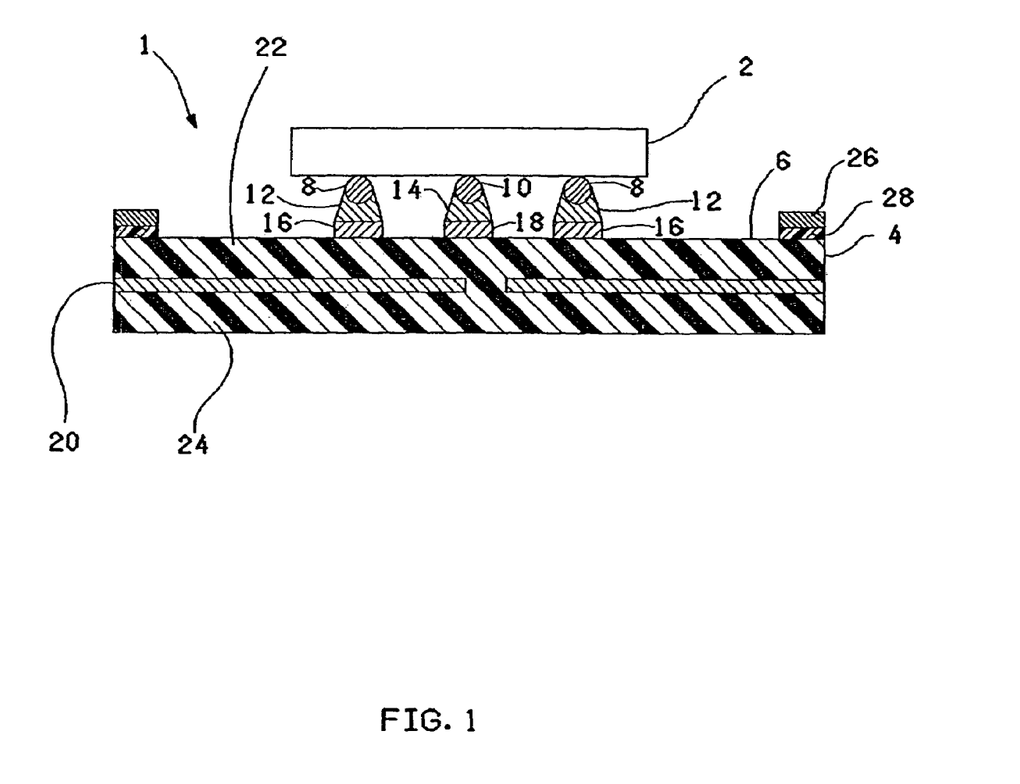
FIG. 1 is a much enlarged partial view in elevation of an electronic package in accordance with a known electrical package.
Figure 2:
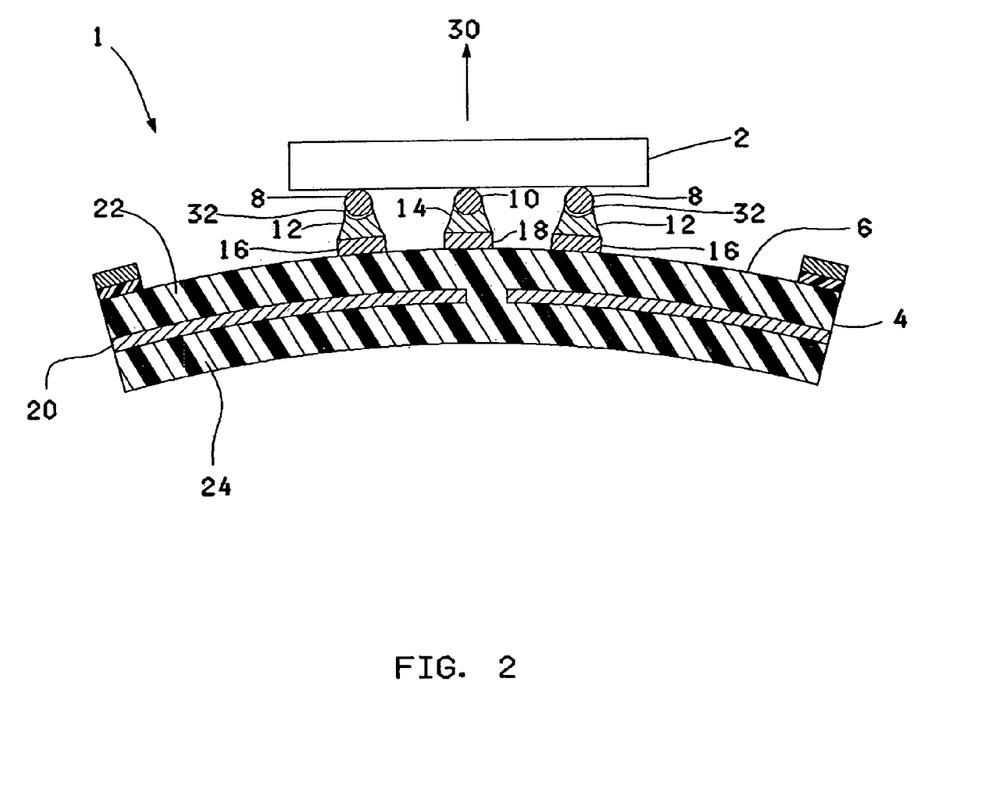
FIG. 2 is a much enlarged partial view in elevation of the electronic package of FIG. 1 at an elevated temperature.

An adverse consequence of chip carrier bowing during build and operation of the chip carrier, particularly when a bonded stiffener ring is used with a compliant organic chip carrier, can be unreliable decoupling of a chip assembled to the chip carrier at the electrical interconnections as illustrated in FIGS. 1 and 2. FIG. 1 illustrates a chip carrier 1 having a semiconductor chip 2 electrically interconnected to circuitized substrate 4 at ambient room temperature, wherein a top surface 6 of the circuitized substrate is substantially flat, and where solder balls 8 and 10 on semiconductor chip 2 are electrically interconnected by solder bumps 12 and 14 to the conductive pads 16 and 18 on the top surface of the circuitized substrate. Circuitized substrate 4 further includes at least one metal layer 20 and layers of compliant non-reinforced dielectric material 22 and 24. A stiffener ring 26 is bonded to the outer perimeter of circuitized substrate 4 by an interfacing adhesive 28. FIG. 2 shows chip carrier 1 of FIG. 1 under temperature elevation, which occurs during the heating stage of the chip joining reflow operation or during operational thermal cycling. At the elevated temperature, the center of chip carrier 1 bows or bulges upward in the direction 30, such that solder bump 14 is in compression while solder bumps 12 are in tension and are stretched. It should be obvious that if excessive bowing occurs during the chip joining reflow operation, separation 32 could occur and tend to produce unreliable solder connections, possibly preventing joining. The added stress of stretching joined solder bumps 12 can damage the bumps. Repeated thermal cycles can result in cracking or complete separation 32 of solder bumps 12. This can result in loss of electrical contact or failure between solder balls 8 of semiconductor chip 2 and conductive pads 16 of circuitized substrate 4, forming an open circuit.

The invention is directed at overcoming the problems set forth above. It is desirable to have an electronic package and a method to make the electronic package that reduces or eliminates flexing of a compliant organic chip carrier during operation to substantially prevent failure of the solder connections between the compliant organic chip carrier and the semiconductor chip.

OBJECTS AND SUMMARY OF THE INVENTION

Accordingly, it is an object of this invention to enhance the art of electronic packaging.

Another object of the present invention is to provide an electronic package with improved operational field life, the electronic package including a circuitized substrate with a first stiffness and a stiffener layer having a second stiffness positioned on the circuitized substrate, the stiffener layer distributing a portion of the first stiffness of the circuitized substrate so as to substantially prevent failure of solder connections between the circuitized substrate and a semiconductor chip positioned on the circuitized substrate.

Yet another object of the present invention is to provide a method of making such an electronic package.

According to one aspect of the invention, there is provided an electronic package comprising a circuitized substrate including a first surface with a first and second portion thereon, the substrate having a first stiffness, a plurality of electrically conductive circuit members positioned on the first portion of the first surface of the circuitized substrate, each of the plurality of electrically conductive circuit members adapted for having solder connections thereon and for being electrically connected to a semiconductor chip, and a stiffener layer having a second stiffness positioned on the second portion of the first surface relative to the first portion, the second stiffness of the stiffener layer distributing a portion of the first stiffness of the circuitized substrate so as to substantially prevent failure of the solder connections between the electrically conductive circuit members and the semiconductor chip during operation of the electronic package.

According to another aspect of the invention, there is provided a method of making an electronic package comprising the steps of providing a circuitized substrate including a first surface with a first and second portion thereon, the substrate having a first stiffness, positioning a plurality of electrically conductive circuit members on the first portion of the first surface of the circuitized substrate, each of the plurality of electrically conductive circuit members adapted for having solder connections thereon and for being electrically connected to a semiconductor chip, and positioning a stiffener layer having a second stiffness on the second portion of the first surface relative to the first portion, the second stiffness of the stiffener layer distributing a portion of the first stiffness of the circuitized substrate so as to substantially prevent failure of the solder connections between the electrically conductive circuit members and the semiconductor chip during operation of the electronic package.

The invention is adaptable to mass production and will provide significant improvement in the ability to manufacture high reliability electronic packages on which semiconductor chips can be assembled.

DETAILED DESCRIPTION OF THE INVENTION

In the following description, like numerals will be used to identify like elements.

Figure 3:
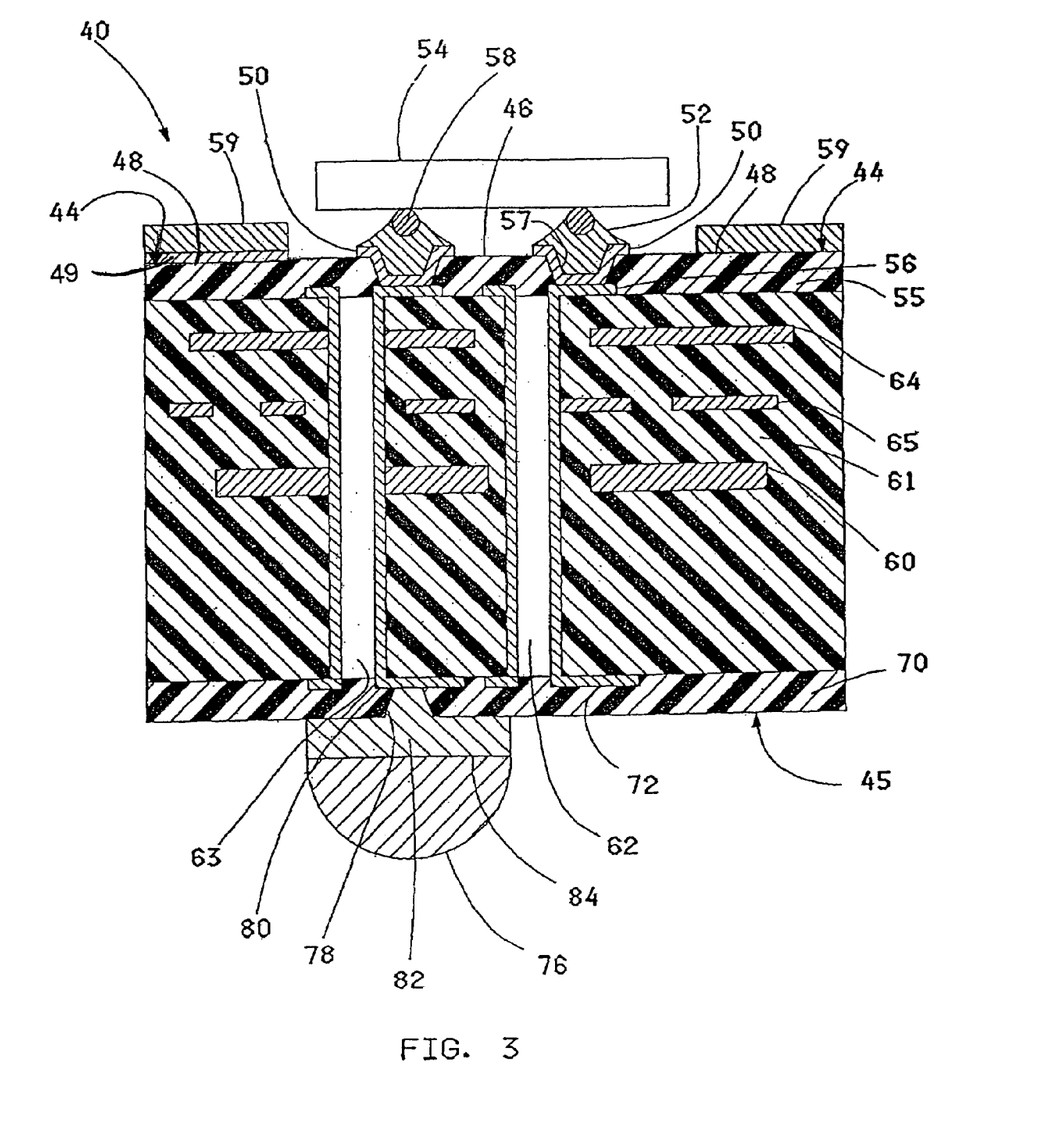
FIG. 3 is a much enlarged partial view, in elevation, of the electronic package according to one embodiment of the present invention illustrating a stiffener layer assembled to a portion of a circuitized substrate and a semiconductor chip assembled to the electronic package.

Referring to FIG. 3, a partial sectional view in elevation of one embodiment of the electronic package 40 of the invention is shown. Electronic package 40 includes a circuitized substrate 42, preferably an organic chip carrier, having a first surface 44 with a first portion 46 and a second portion 48 thereon. Circuitized substrate 42 includes a second surface 45. The circuitized substrate has a first stiffness from about 0.1 Mpsi to about 10 Mpsi. The first stiffness is an overall measure of the average stretching stiffness (in-plane stiffness) through the entire thickness of circuitized substrate 42. The first stiffness will be described in more detail below. Circuitized substrate 42 includes a plurality of electrically conductive circuit members 50 positioned on first portion 46 of first surface 44. The electrically conductive circuit members are preferably comprised of a metal, the metal being selected from the group consisting of copper, nickel, molybdenum, chromium and alloys thereof. The metal can also be comprised of gold. Each of the plurality of electrically conductive circuit members 50 is adapted for having solder connections 52 for being electrically connected to a semiconductor chip 54.

The plurality of electrically conductive circuit members 50 are shown as a first plurality of microvias. The plurality of microvias 50 are a first plurality of openings with internal walls formed in a first layer of dielectric material 55 that expose at least portions of a first plurality of electrically conductive members 56. Each of the first plurality of openings includes a layer of electrically conductive material 57, preferably copper, positioned on the internal walls of the first plurality of openings and on portions of selected ones of the first plurality of electrically conductive members 56. Solder connections 52 are comprised of a low melt solder (melting temperature below about 230 degrees Celsius (° C.)), preferably eutectic solder, comprised of a composition of about 63% by weight lead and about 37% by weight tin. Solder connections 52 are formed by reflowing an array of solder balls or solder paste (neither shown) positioned on selected ones of the plurality of electrically conductive circuit members 50. Other solder shapes that, for example, can also be used as solder connections 52 are solder columns, cylinders, or cones, illustrative examples of which can be found in U.S. Pat. Nos. 5,060,844, 5,251,806, 5,324,892, 5,639,696, 5,861,663, 6,053,394, and 6,127,204. These patents are incorporated herein by reference. The solder shapes can change because of wetting of the solder to electrically conductive circuit members 50 during melt (not shown). Semiconductor chip 54 includes a plurality of contact members 58, preferably solder balls, each electrically coupled to respective solder connections 52 on the plurality of electrically conductive circuit members 50. Solder balls 58 are comprised of solder material having a composition of about 97% by weight lead and about 3% by weight tin with a melting point of about 310° C. Solder balls 58 can be made by a Controlled Collapse Chip Connection process ($C_4$) known in the art.

Circuitized substrate 42 includes a stiffener layer 59 having a second stiffness different than that of the circuitized substrate positioned on second portion 48 of first surface 44 relative to first portion 46. First portion 46 corresponds to the area substantially under semiconductor chip 54 on first surface 44 of circuitized substrate 42. Portion 48 is the area outside of portion 46. Stiffener layer 59 can be adhered by a layer of thermally conductive adhesive 49. Examples of suitable thermally conductive adhesives that can be used in this invention are Bondply 108 (Bondply is a trademark of The Bergquist Company, Chanhassen, Minn.), Pyralux (Pyralux is a trademark of the E.I. DuPont deNemours & Company, Wilmington, Del.), and Thermattach T404 (Thermattach is a trademark of Chomerics, Div. of Parker Hannifin, Woburn, Mass.).

Stiffener layer 59 can be laminated directly to second portion 48 of first surface 44 without a thermally conductive adhesive, as shown in FIG. 3. The second stiffness of the stiffener layer 59 can be from about 1.5 to about 10 times the first stiffness of circuitized substrate 42 so as to substantially prevent failure of solder connections 52 between the plurality of electrically conductive circuit members 50 and the plurality of contact members 58 on semiconductor chip 54 during operation of electronic package 40. The term operation is used to define any activity that can lead to thermal cycling of electronic package 40 and can include manufacture, test, burn-in, or field operation.

Circuitized substrate 42 includes at least one conductive layer 60 which comprises a metal. Layer 60 can also contain some dielectric material which is used to fill features such as clearance holes around conductive through holes. Circuitized substrate 42 also includes a second dielectric layer 61. Second dielectric layer 61 may also include a small percentage of metal features, such as a portion of conductive through holes 62 and 63. Significantly, the second dielectric layer does not contain conventional woven fiberglass; such absence of woven fiberglass enabling first and second conductive through holes 62 and 63, respectively, to be closely spaced. Indeed, spacing less than about 0.040 inches (40 mils.) and preferably less than about 8 mils. between centers is achievable without electrically shorting between adjacent conductive through holes. The second layer of dielectric material 61 is comprised of an organic polymeric material, which can be filled with a particulate filler. The dielectric constant of the second layer of dielectric material 61 is preferably from about 1.5 to about 3.5, more preferably from about 2 to about 3. The thickness of the filled dielectric layer can vary according to the desired design performance characteristics of circuitized substrate 42. The coefficient of thermal expansion of dielectric layer 61 is preferably from about 15 to about 25 parts per million per ° C. (ppm/° C.), more preferably from about 16 to about 20 ppm/° C., to give a close match to the thermal expansion of conductive through holes 62 and 63. Preferably, the particulate filler has a diameter less than about 10 microns (lm), more preferably from about 1 to about 5 lm. Preferably, the particulate filler is present from about 30 to about 70 percent by weight, more preferably from about 40 to about 60 percent by weight of second dielectric material 61. Suitable materials for the filler include silica, crystalline organics, amorphous organics, and blends thereof as is known in the art, to obtain a second dielectric material with an effective modulus which ranges from about 10,000 to about 200,000 psi, nominally about 50,000 psi. Suitable materials for second layer of dielectric material 61 include, for example, cyanate ester and polytetrafluoroethylene. A suitable silica filled polytetrafluoroethylene is available as HT 2800 from Rogers Corporation, Rogers, Conn. Second dielectric layer 61 can also include at least one electrically conductive metal layer 64, within the dielectric layer for serving as power and/or ground connections. The layer of second dielectric material 61 can further include at least one other layer 65 therein, layer 65 comprising a number of electrically conductive features, separated and insulated from one another by dielectric material. Electrically conductive layer 65 preferably comprises a signal carrying conductor. Electrically conductive layer 65 is typically positioned between electrically conductive layer 64 and the metal layer 60. Electrically conductive layers 64 and 65 are preferably comprised of a suitably conductive metal such as copper or molybdenum and can have a thickness of from about 0.20 to about 2.0 mils, preferably about 0.50 mils. Significantly, signal carrying conductive layer 65, when positioned as shown, is shielded by electrically conductive layers 60 and 64, which significantly improves signal integrity.

Metal layer 60 can be a suitable metal comprised of nickel, copper, molybdenum, chromium, iron, and alloys thereof. Preferably, the metal comprising this layer functions both as an overall thermal expansion control layer and an electrically conductive ground or voltage reference plane.

The preferred structure for metal layer 60 is a three layered structure comprised of a first layer of copper, a second layer of an alloy of about 34% to about 38% nickel (preferably about 36% nickel) and about 62% to about 66% iron (preferably about 63% iron), and a third layer of copper. The overall CTE of metal layer 60 is from about 4 to about 8 ppm/° C. Preferably, about 72% to about 80% of the thickness of the metal layer is the nickel-iron alloy and about 20% to about 28% of the thickness is copper. A suitable 36% nickel-63% iron alloy is available under the trademark Invar from Texas Instruments Incorporated, Attleboro, Mass. Alternatively, the metal layer can be formed solely of a single metal alloy such as alloy having about 36% nickel and about 63% iron. The thickness of the metal layer is preferably from only about 1 mil. to about 3 mils. The thickness and choice of material for metal layer 60 and layers 55, 61, 64, and 65, will affect the first stiffness and overall thermal expansion of circuitized substrate 42.

First conductive through hole 62 is positioned under semiconductor chip 54 and is electrically connected to at least one of the first plurality of electrically conductive members 56. First conductive through hole 62 is also electrically connected to at least one of the electrically conductive layers 65. Second conductive through hole 63 is also positioned under semiconductor chip 54 and can also be electrically connected to at least the other electrically conductive layer 64. First and second conductive through holes 62 and 63 have an unplated diameter from about 1.5 to about 3.0 mils and can be formed by mechanical or laser drilling, preferably by laser drilling with a commercially available YAG or excimer laser. Each conductive through hole includes a layer of about 0.15 to about 1.0 mils of a suitable metal, preferably copper. It is preferable that each contact member 58 of semiconductor chip 54 be electrically connected to no more than one conductive through hole.

The first layer of dielectric material 55 is positioned on second layer of dielectric material 61 and on at least a portion of selected ones of the first plurality of electrically conductive members 56. First layer of dielectric material 55 can substantially cover (tent) first and second conductive through holes 62 and 63 and even at least partially fill the conductive through holes. A third layer of dielectric material 70 is also positioned on second layer of dielectric material 61 and on at least a portion of selected ones of a second plurality of electrically conductive members 72. Dielectric layers 55 and 70 can be comprised of a suitable organic polymeric material. One dielectric material that can be used is a polyimide material. Another material that can be used is a resin material coated onto a copper foil. The preferred polymeric dielectric, being both photo-imageable and laser ablatable, has solids which are comprised of from about 10% to about 80% by weight (preferably about 30%) of phenoxy polyol resin which is the condensation product of epichlorohydrin and bisphenol A, having a molecular weight of from about 40,000 to about 130,000; from about 20% to about 90% by weight (preferably about 25%) of an epoxidized multifunctional bisphenolA; a formaldehyde novolac resin having a molecular weight of from about 4,000 to about 10,000 (preferably about 5,000 to about 7,000); from 0% to about 50% by weight and preferably about 45% by weight, of a halogenated, preferably brominated, deglycidyl ether of bisphenolA having a molecular weight of from about 600 to about 2,500; and from about 0.1 to about 15 parts (preferably about 5 parts) by weight of the total resin weight as cationic photo-initiator. The solvent component of the dielectric is preferably comprised of propylene glycol monomethyl ether acetate and about 0% to less than about 10% by weight of propylene carbonate, the propylene carbonate being the preferred carrier for the preferred photoinitiator.

The first layer of dielectric material 55 includes the aforementioned first plurality of microvias 50. Selected ones of the first plurality of microvias 50 electrically couple to respective ones of solder connections 52. Each of the solder connections 52 are designed to efficiently match and electrically couple the plurality of contact members 58 on semiconductor chip 54. Preferably, there is a match of no more than one contact member 58 with one of the conductive through holes 62 or 63 under the semiconductor chip providing a direct and distinct electrical path from each of the plurality of contact members 58 to signal carrying electrically conductive layer 65 (through one of the solder connections 52, one of the first plurality of electrically conductive circuit members 50, one of the first plurality of electrically conductive members 50, and one conductive through hole 62). The direct electrical path from contact member 58 to a shielded signal conductor provides a relatively short and efficient electrical path for signals to be transmitted from semiconductor chip 54 through the multi-layered circuitized structure 42 and to the outside environment through solder connections 76.

Figure 5:
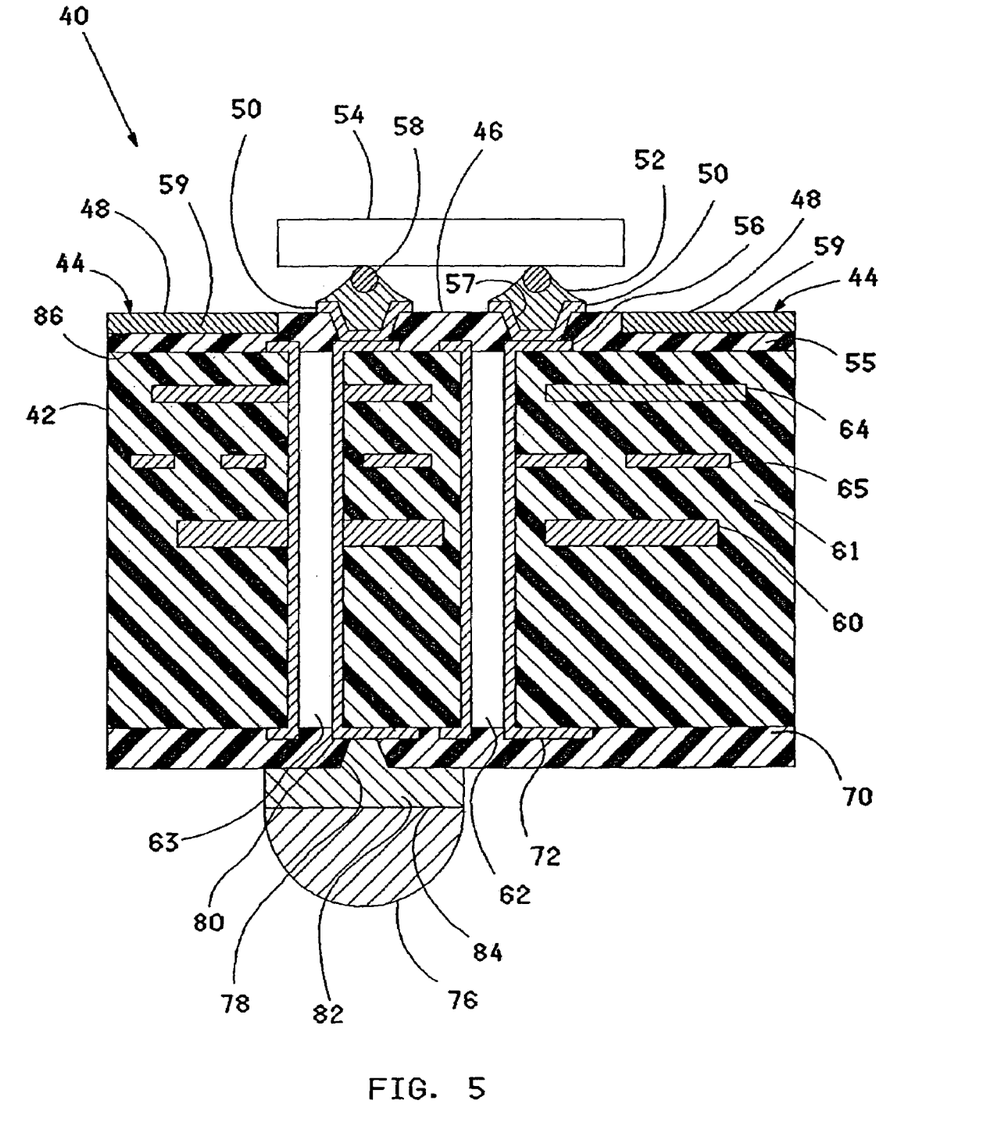
FIG. 5 is a much enlarged partial view in elevation of another embodiment of the present invention.
Figure 7:
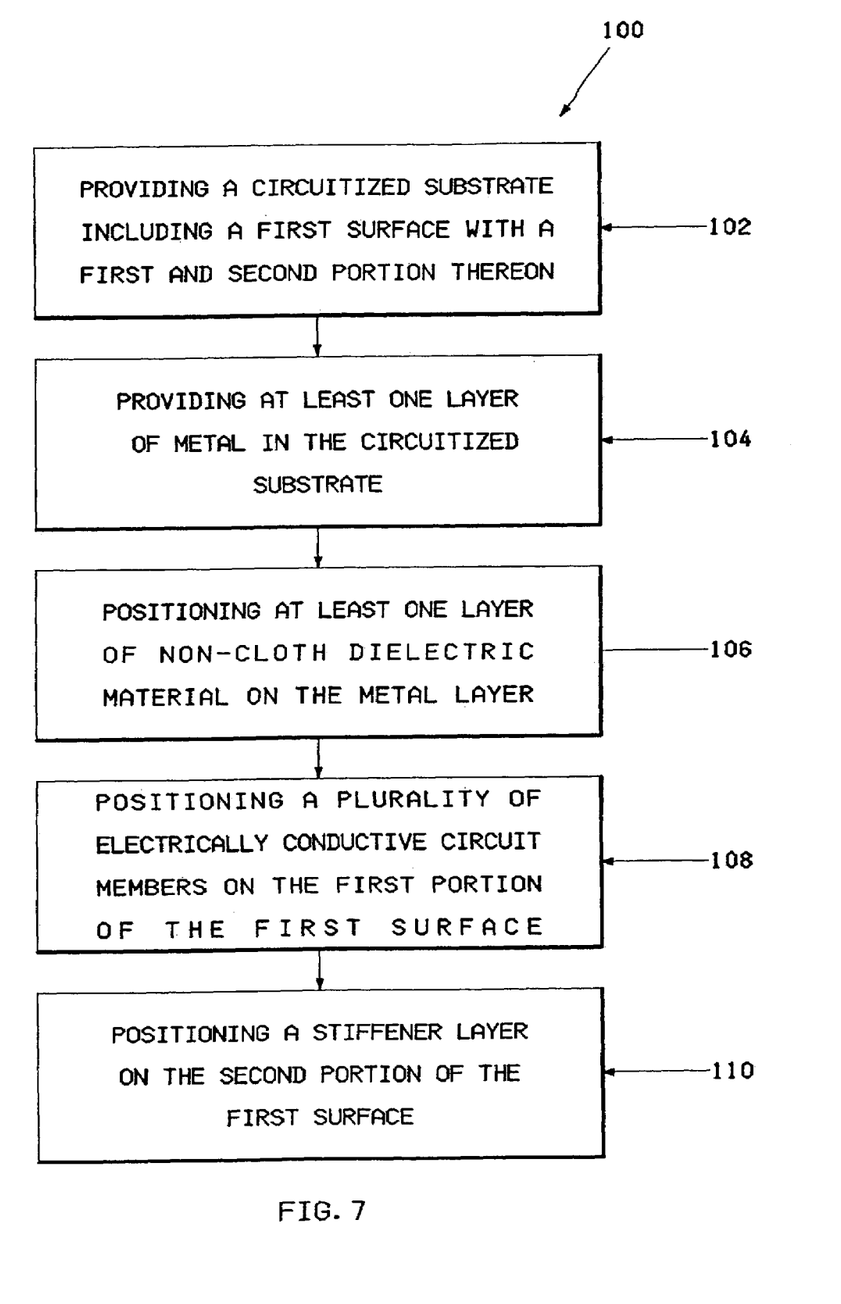
FIG. 7 is a process flow diagram showing the method for making the electronic package according to the present invention.

The third layer of dielectric material 70 includes a second plurality of microvias 78. The second plurality of microvias are a second plurality of openings with internal walls formed in the third layer of dielectric material that expose portions of a second plurality of electrically conductive members 80 that each may also be connected to a respective plated through hole. Each of the second plurality of microvias includes a layer of electrically conductive material 82 positioned on the internal walls of the openings and on the exposed portions of the second plurality of electrically conductive members 80 to form a plurality of bonding pads 84. Only one bonding pad 84 is shown in FIGS. 3, 5, and 7 for ease of illustration. The conductive material on the internal walls of the first and second pluralities of openings and on the exposed portions of the first and second pluralities of electrically conductive members 56 and 80 in the first and third layers of dielectric material is preferably plated copper.

Figure 4:
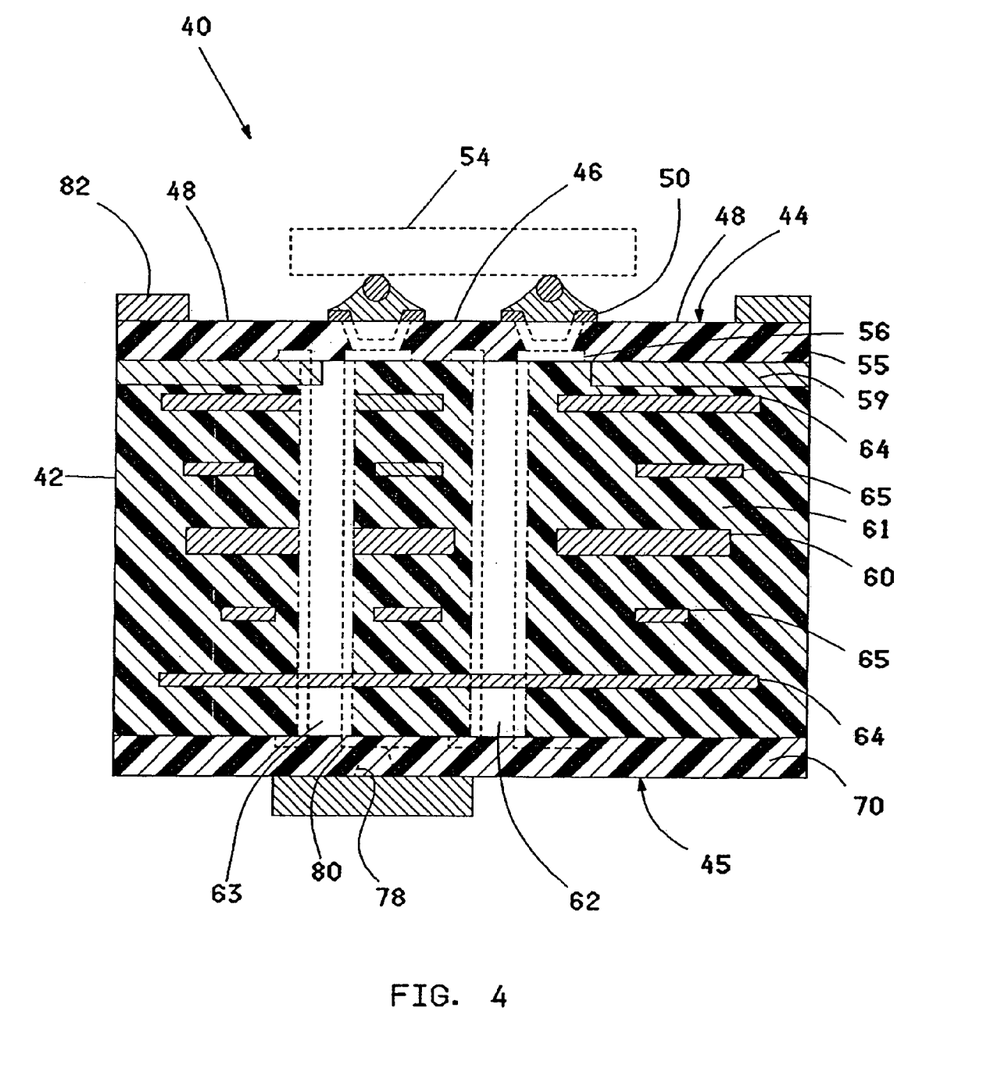
FIG. 4 is a partial view, in elevation, of another example of the electronic package of the present invention.

An example of the invention is illustrated in FIG. 4 and described hereinbelow. In FIG. 4, a partial view in elevation of an electronic package of the present invention is illustrated in a plane taken through substrate 42 outside the area directly under the semiconductor chip 54. Circuitized substrate 42 includes stiffener layer 59 of copper in second layer of dielectric material 61. Second layer of dielectric material 61 also includes one layer of metal 60, two electrically conductive layers 64, and two other electrically conductive layers 65. The portion of the plurality of electrically conductive circuit members 50 in first dielectric layer 55, semiconductor chip 54, the first plurality of electrically conductive members 56, conductive through holes 62 and 63, second plurality of electrically conductive members 80 and second plurality of microvias 78 are all shown as hidden. A stiffener ring 82 is bonded to the outer perimeter of second portion 48 of top surface 44 of circuitized substrate 42 to enhance the structural characteristics of the circuitized substrate.

As previously discussed, the first stiffness of circuitized substrate 42 is an overall measure of the average stretching stiffness through the entire thickness from first surface 44 to second surface 45 of the circuitized substrate taking into account the various materials in layers 55, 60, 61, 64, and 65 through the entire thickness. The first stiffness value can vary by region depending on circuitry features or other features in that region. For example, if there is a higher percentage of stiffening material 59 included in a region or area, the overall stiffness of the laminate in that region or area will be increased. In particular, if the stiffening material 59 is included nearer first surface 44 of region 48, stiffness in that region will be increased while the overall stiffness of the circuitized substrate can remain similar. By including stiffening layer 59 near first surface 44 (that is, within about 20% of the overall thickness of circuitized substrate 42), region 48 can be made to have a locally higher stretching stiffness near the surface 44, with the remainder of the laminate stiffness unchanged. This gives the effect of having a nonuniform distribution of stiffness through the laminate. By utilizing this effect, the stiffness can be designed and varied by region. In FIG. 4, region 48 is depicted with additional stiffness near the surface 44, and region 46 is less stiff. By evaluating different stiffnesses of regions of circuitized substrate 42, near surface 44, the bowing tendency, described hereinabove, due to the restraining effect of bonded stiffener ring 82, can be compensated for without substantially altering the first stiffness or overall stretching stiffness of the circuitized substrate. By including regions of higher stiffness nearer first surface 44, the overall stretching stiffness or first stiffness of the laminate can be nonuniformly distributed. This nonuniform distribution of first stiffness through the thickness of the laminate gives designers the ability to provide compensation and resistance to bowing from various stresses which are applied to first surface 44 by stiffener ring 82, semiconductor chip 54, etc. This compensation allows designers to retain compliant low-stress characteristics of circuitized substrate 42, by retaining a relatively lower value for first stiffness.

TABLE 1

Layup design for circuitized substrate in region 46.

| layer | thickness mils | % metal | dielect modulus Mpsi | metal modulus Mpsi | layer stiffness Mpsi |
|---|---|---|---|---|---|
| 55 | 2.1 | 0 | 0.9 | | 0.9 |
| 61 | 1.45 | 0 | 0.05 | | 0.05 |
| 64 | 0.5 | 95 | 0.05 | 17 | 16.1525 |
| 61 | 1.1 | 0 | 0.05 | | 0.05 |
| 65 | 0.5 | 10 | 0.05 | 17 | 1.745 |
| 61 | 1.6 | 0 | 0.05 | | 0.05 |
| 60 | 2 | 95 | 0.05 | 17 | 16.1525 |
| 61 | 1.6 | 0 | 0.05 | | 0.05 |
| 65 | 0.5 | 10 | 0.05 | 17 | 1.745 |
| 61 | 1.1 | 0 | 0.05 | | 0.05 |
| 64 | 0.5 | 95 | 0.05 | 17 | 16.1525 |
| 61 | 1.45 | 0 | 0.05 | | 0.05 |
| 70 | 2.1 | 0 | 0.9 | | 0.9 |
| total | 16.5 | | | first stiffness | 3.30 |

Table 1. Layup Design for Circuitized Substrate in Region 46.

Table 1, column 1, depicts the lay up design for circuitized substrate 42 of FIG. 4 below first portion 46, the number 55 in the first row of column 1 and the number 70 in the last row of column 1, representing the first and third dielectric layers respectively, of circuitized substrate 42 below first portion 46. The numbers in the intervening rows of column 1 represent the other layers between first and third dielectric layers in circuitized substrate 42. It is understood that layer 61 is divided into six separate portions, depending on which other layers (i.e., 64 and 65) the portion is located between. Table 1 illustrates how the various layers of dissimilar materials and their dimensions through the thickness of circuitized substrate 42 below first portion 46 affects the overall average stretching stiffness or first stiffness of the circuitized substrate. For each layer, more than one material within a layer is shown in the table, because through the thickness of a given layer, various design features (such as clearance holes through a metal layers) will exist. The percentage of metal of each layer is shown in the third column, and the next two columns show typical material properties for the metal and dielectric which each layer contains. The last column indicates the layer stiffness of each layer as a composite modulus, and the last line indicates the overall average stretching stiffness for this laminate. In Table 1, a laminate with uniform distribution of layer stiffnesses is shown, as the values above and below the central layer 60 are symmetric. The "total" line at the bottom of Table 1 illustrates the overall thickness of circuitizd substrate 42 of FIG. 4 below first portion 46 as being 16.5 mils with the overall first stiffness, as being about 3.3 Mpsi.

TABLE 2

Layup design for circuitized substrate in region 48.

| layer | thickness mils | % metal | dielect modulus Mpsi | metal modulus Mpsi | layer stiffness Mpsi |
|---|---|---|---|---|---|
| 55 | 1.1 | 0 | 0.9 | | 0.9 |
| 59 | 1 | 95 | 0.9 | 17 | 16.195 |
| 61 | 1.45 | 0 | 0.05 | | 0.05 |
| 64 | 0.5 | 95 | 0.05 | 17 | 16.1525 |
| 61 | 1.1 | 0 | 0.05 | | 0.05 |
| 65 | 0.5 | 10 | 0.05 | 17 | 1.745 |
| 61 | 1.6 | 0 | 0.05 | | 0.05 |
| 60 | 2 | 95 | 0.05 | 17 | 16.1525 |
| 61 | 1.6 | 0 | 0.05 | | 0.05 |
| 65 | 0.5 | 10 | 0.05 | 17 | 1.745 |
| 61 | 1.1 | 0 | 0.05 | | 0.05 |
| 64 | 0.5 | 95 | 0.05 | 17 | 16.1525 |
| 61 | 1.45 | 0 | 0.05 | | 0.05 |
| 70 | 2.1 | 0 | 0.9 | | 0.9 |
| total | 16.5 | | | | first stiffness 4.22 |

Table 2. Layup Design for Circuitized Substrate in Region 48.

Table 2 illustrates the first stiffness of circuitized substrate 42 under second portion 48 (including copper stiffener layer 59,) as being about 4.2 Mpsi. Recall that Table 1 defined the part of circuitized substrate 42 under portion 46. This is an increase from the value shown in Table 1 of less than 30%. However, a very significant increase in stiffness of the upper region of the laminate layers is observed, due to addition of layer 59, and there is now a nonuniform distribution of stiffness of the layers comprising substrate 42 as there is no longer a symmetric distribution of individual layer stiffnesses around the central ground plane and there is a higher value of stiffness of the upper layers near the surface 44.

Providing stiffener layer 59 with a stiffness of 17 Mpsi near first surface 44 provides greatly increased resistance to bending due to thermally driven stress described hereinabove, by utilizing the increased layer stiffness to provide increasing resistance to applied stress. It also provides for resistance to thermally driven strains imposed by semiconductor chip 54 and underfill (not shown) which may be applied between the semiconductor chip and first surface 44 of circuitized substrate 42, e.g., to encapsulate the solder connections under the chip.

Figure 6:
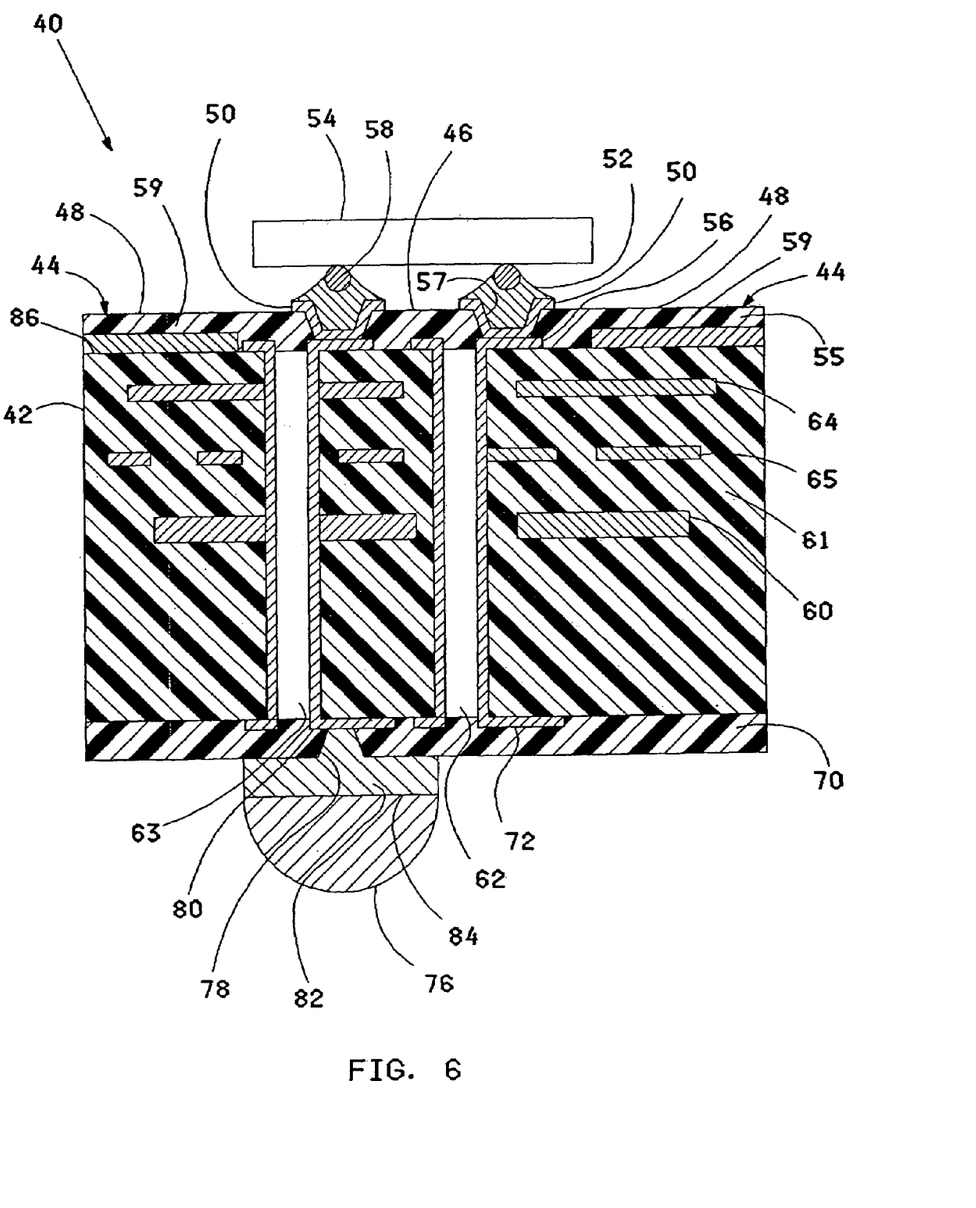
FIG. 6 is a much enlarged partial view in elevation of yet another embodiment of the present invention of FIG. 3.

FIGS. 5 and 6 illustrate a partial sectional view in elevation of the embodiment shown in FIG. 3 with stiffener layer 59 positioned at two different locations within first layer of dielectric material 55 in second portion 48 of first surface 44 of circuitized substrate 42. In FIG. 5, stiffener layer 59 is positioned within second portion 48 such that one edge of stiffener layer 59 is substantially planar with first surface 44. The bottom surface 86 of dielectric layer 55 is in contact with the portion of the circuitized substrate 42 that is beneath the dielectric layer 55. In FIG. 6, stiffener layer 59 is positioned within second portion 48 with one edge of stiffener layer 59 positioned on second layer of dielectric material 61. Positioning of stiffener layer 59 is not limited to the positions described herein, but can be positioned at any location within second portion 48 such that the stiffener layer 59 distributes a portion of the first stiffness of circuitized substrate 42 so as to substantially prevent failure of solder connections 52 between the plurality of electrically conductive circuit members 50 and semiconductor chip 54 during operation of electronic package 40.

Referring to FIG. 7, a method 100 of making an electronic package is shown. The first step 102 in this method is providing a circuitized substrate including a first surface with a first and second portion thereon. The circuitized substrate has been previously described in detail above and includes a first stiffness. Next, step 104 includes providing at least one layer of metal in the circuitized substrate, the layer of metal having first and second opposing surfaces. The metal layer has also been previously described in detail above.

Step 106 includes positioning at least one layer of the above-defined non-cloth dielectric material on the first and second opposing surfaces of the metal layer. The non-cloth dielectric material is laminated to the metal layer at a pressure of about 1000 to about 2000 psi. at a temperature of about 600 to about 750 degrees Fahrenheit.

Step 108 includes positioning a plurality of electrically conductive circuit members on the first portion of the first surface of the circuitized substrate. The plurality of electrically conductive circuit members can be comprised of a plurality of metal pads or other suitable structures for accepting solder connections. Preferably, the plurality of the electrically conductive circuit members is a plurality of previously-described microvias in a first layer of dielectric material. The plurality of electrically conductive circuit members is adapted for having solder connections of the type defined above thereon, for being electrically connected to selected ones of a plurality of contact members of a semiconductor chip. The microvias can be formed by a process of mechanical drilling, etching, or preferably laser ablating the first layer of dielectric material. The resulting openings are then plated with a suitable metal, preferably copper, forming electrical connections from the surface of the circuitized substrate to selected ones of an exposed first plurality of electrically conductive members. A plurality of solder balls or solder paste is then applied to the plated first plurality of microvias, the preferred solder paste being a low melt solder paste, preferably a eutectic solder paste. An example of suitable eutectic solder paste that can be used is OMNIX 5000 from Alpha Metals, Jersey City, N.J. A lead free solder can also be used. The plurality of solder balls or solder paste can then be reflowed to form solder connections on the first plurality of electrically conductive members.

The electronic package described herein provides signal and power distribution characteristics which complement high performance electrical demands of future semiconductor chips and is particularly suited for interconnecting high I/O (greater than 400 I/O) semiconductors The electronic package includes a stiffener layer that substantially prevents failure of electrical interconnections between the electronic package and the semiconductor chip during manufacture and operation.

The package taught step 110 herein includes a stiffener layer positioned on a portion of, or near, the top surface of a circuitized substrate which is part of the package. This is particularly useful when a bonded stiffener ring is used with a compliant or flexible organic circuitized substrate. It avoids reliability problems related to damage and decoupling of a semiconductor chip assembled to the circuitized substrate at the electrical interconnections, as illustrated in FIGS. 1 and 2. It provides more stiffness near the top surface of the circuitized substrate and so more resistance to strains which could occur within the flexible circuitized substrate imposed by the semiconductor chip (and any underfill) during thermal cycling. The package also avoids excessive bowing that can occur during the semiconductor chip joining reflow operation thus avoiding separation between the semiconductor chip and the circuitized substrate.

A low impedance power distribution is achieved using the solid copper power planes and high density conductive through holes under the semiconductor chip which allow multiple vertical power feeds to the semiconductor chip. Further electrical performance benefits and preservation of signal integrity (fast signal propagation, low signal capacitance and coupled noise, and matched characteristic impedance) are achieved in the electronic package by use of low dielectric constant polytetrafluoroethylene material, the signal carrying conductors being arranged internally in a shielded arrangement, and a direct short path length from the semiconductor chip contact members to the signal carrying conductors.

While there have been shown and described what are at present considered the preferred embodiments of this invention, it will be obvious to those skilled in the art that various changes and modifications can be made therein without departing from the scope of the invention as defined by the appended claims.

We claim:

1. An electronic package comprising:
   a circuitized substrate including a first surface with a first and second portion thereon, said substrate having a first stiffness;
   a plurality of electrically conductive circuit members positioned on said first portion of said first surface of said circuitized substrate, each of said plurality of electrically conductive circuit members adapted for having solder connections thereon and for being electrically connected to a semiconductor chip; and
   a stiffener layer having a second stiffness positioned on said second portion of said first surface relative to said first portion, said second stiffness of said stiffener layer distributing a portion of said first stiffness of said circuitized substrate so as to substantially prevent failure of said solder connections between said electrically conductive circuit members and said semiconductor chip during operation of said electronic package, wherein said circuitized substrate includes a layer of adhesive positioned on at least a portion of said second portion of said first surface of said circuitized substrate to adhere said stiffener layer to said first surface.

2. The electronic package of claim 1, wherein said circuitized substrate comprises at least one layer of metal.

3. The electronic package of claim 2, wherein said at least one layer of metal is selected from the group consisting of nickel, copper, molybdenum, iron, chromium, gold, and alloys thereof.

4. The electronic package of claim 1, wherein said circuitized substrate comprises at least one layer of non-cloth dielectric material.

5. The electronic package of claim 1, wherein said layer of adhesive is thermally conductive.

6. The electronic package of claim 1, wherein said package further includes said semiconductor chip, said semiconductor chip attached to said circuitized substrate by said solder connections.

7. An electronic package comprising:
   a circuitized substrate including a first surface with a first and second portion thereon, said substrate having a first stiffness;
   a plurality of electrically conductive circuit members positioned on said first portion of said first surface of said circuitized substrate, each of said plurality of electrically conductive circuit members adapted for having solder connections thereon and for being electrically connected to a semiconductor chip; and
   a stiffener layer having a second stiffness positioned on said second portion of said first surface relative to said first portion, said second stiffness of said stiffener layer distributing a portion of said first stiffness of said circuitized substrate so as to substantially prevent failure of said solder connections between said electrically conductive circuit members and said semiconductor chip during operation of said electronic package, wherein said first stiffness of said circuitized substrate is from about 0.1 Mpsi to about 10 Mpsi.

8. The electronic package of claim 1, wherein said plurality of electrically conductive circuit members are comprised of a metal selected from the group consisting of copper, nickel, molybdenum, chromium, gold, and alloys thereof.

9. The electronic package of claim 1, wherein said solder connections are comprised of an array of balls, bumps, or columns.

10. The electronic package of claim 1, wherein said stiffener layer comprises a metal.

11. The electronic package of claim 10, wherein said metal is selected from the group consisting of nickel, copper, molybdenum, iron, chromium, gold, and alloys thereof.

12. The electronic package of claim 1, wherein said stiffener layer is positioned within said second portion of said first surface of said circuitized substrate.

13. An electronic package comprising:
   a circuitized substrate including a first surface with a first and second portion thereon, said substrate having a first stiffness;
   a plurality of electrically conductive circuit members positioned on said first portion of said first surface of said circuitized substrate, each of said plurality of electrically conductive circuit members adapted for having solder connections thereon and for being electrically connected to a semiconductor chip; and
   a stiffener layer having a second stiffness positioned on said second portion of said first surface relative to said first portion, said second stiffness of said stiffener layer distributing a portion of said first stiffness of said circuitized substrate so as to substantially prevent failure of said solder connections between said electrically conductive circuit members and said semiconductor chip during operation of said electronic package, wherein said second stiffness of said stiffener layer is from about 1.5 to about 20 times said first stiffness of said circuitized substrate.

14. A method of making an electronic package comprising the steps of:
provxading a circuitized substrate including a first surface with a first and second portion thereon, said substrate having a first stiffness;
adhering a plurality of electrically conductive circuit members on said first portion of said first surface of said circuitized substrate, each of said plurality of electrically conductive circuit members adapted for having solder connections thereon and for being electrically connected to a semiconductor chip; and
positioning a stiffener layer having a second stiffness on said second portion of said first surface relative to said first portion said circuitized substrate including a layer of adhesive positioned on at least a portion of said second portion of said first surface of said circuitized substrate to adhere said stiffener layer to said first surface, said second stiffness of said stiffener layer distributing a portion of said first stiffness of said circuitized substrate so as to substantially prevent failure of said solder connections between said electrically conductive circuit members and said semiconductor chip during operation of said electronic package.

15. The method of claim 14, wherein said layer of adhesive is thermally conductive.

16. The method of making the electronic package of claim 14, wherein said step of providing said circuitized substrate includes providing at least one layer of metal therein, said layer of metal having first and second opposing surfaces.

17. The method of making the electronic package of claim 16, further including the step of positioning at least one layer of non-cloth dielectric material on said first and second opposing surfaces of said metal layer.

18. The method of making the electronic package of claim 17, wherein said step of positioning at least one layer of non-cloth dielectric material on said first and second opposing surfaces of said metal layer comprises laminating said non-cloth dielectric material at a pressure of about 1000 to about 2000 psi at temperature of about 600 to about 750 degrees Fahrenheit for about 0.5 hours to about 4 hours.

19. The method of claim 14, wherein said step of positioning said stiffener layer comprises the step of positioning said stiffener layer under said second portion of said first surface of said circuitized substrate.

20. The method of claim 14, further including providing said semiconductor chip and attaching said semiconductor chip to said circuitized substrate with said solder connections.

21. An electronic package comprising:
a circuitized substrate including a first surface with a first and second portion thereon, said substrate having a first stiffness;
a plurality of electrically conductive circuit members positioned on said first portion of said first surface of said circuitized substrate, each of said plurality of electrically conductive circuit members adapted for having solder connections thereon and for being electrically connected to a semiconductor chip; and
a stiffener layer having a second stiffness positioned on said second portion of said first surface relative to said first portion, said second stiffness of said stiffener layer distributing a portion of said first stiffness of said circuitized substrate so as to substantially prevent failure of said solder connections between said electrically conductive circuit members and said semiconductor chip during operation of said electronic package, wherein said first stiffness of said circuitized substrate is from about 0.1 Mpsi to about 10 Mpsi.

22. An electronic package comprising:
a circuitized substrate including a first surface with a first and second portion thereon, said substrate having a first stiffness;
a plurality of electrically conductive circuit members positioned on said first portion of said first surface of said circuitized substrate, each of said plurality of electrically conductive circuit members adapted for having solder connections thereon and for being electrically connected to a semiconductor chip; and
a stiffener layer having a second stiffness positioned on said second portion of said first surface relative to said first portion, said second stiffness of said stiffener layer distributing a portion of said first stiffness of said circuitized substrate so as to substantially prevent failure of said solder connections between said electrically conductive circuit members and said semiconductor chip during operation of said electronic package, wherein said second stiffness of said stiffener layer is from about 1.5 to about 20 times said first stiffness of said circuitized substrate.

* * * * *

UNITED STATES PATENT AND TRADEMARK OFFICE
CERTIFICATE OF CORRECTION

PATENT NO. : 6,992,379 B2  Page 1 of 1
DATED : January 31, 2006
INVENTOR(S) : Alcoe et al.

It is certified that error appears in the above-identified patent and that said Letters Patent is hereby corrected as shown below:

<u>Title page,</u>
Item [56], References Cited, U.S. PATENT DOCUMENTS, add:
-- 6,373,717        4/2002          Downes, Jr. et al. --.

<u>Column 5,</u>
Line 8, delete "Circutized" and insert -- Circuitized --.

<u>Column 11,</u>
Line 10, delete "step 110 herein" and insert -- herein step 110 --.

<u>Column 13,</u>
Line 11, delete "adhering" and insert -- positioning --.
Line 17, delete "positioning" and insert -- adhering --.
Line 20, delete "adhesive" and insert -- adhesive, --.

Signed and Sealed this

Twenty-fifth Day of April, 2006

JON W. DUDAS
*Director of the United States Patent and Trademark Office*